VARIABLE REACTANCE TRANSISTOR CIRCUIT

Filed May 14, 1963

VARIABLE REACTANCE DEVICE

VARIABLE FREQUENCY OSCILLATOR

INVENTOR.
DALE D. SKINNER
BY Ervin F. Johnston
George F. Rubens
ATTORNEYS

United States Patent Office 3,267,397
Patented August 16, 1966

3,267,397

VARIABLE REACTANCE TRANSISTOR CIRCUIT

Dale D. Skinner, Turtle Creek, Pa., assignor, by mesne assignments, to the United States of America as represented by the Secretary of the Navy Filed May 14, 1963, Ser. No. 280,475
2 Claims. (Cl. 333—80)

The present invention relates to an inductive reactance device and more particularly to a device in which a small change in the resistance therein will result in a correspondingly large change in the inductive reactance therein.

The present invention contemplates the use of a transistor and can be used to provide a variable reactance device or an oscillator with either a fixed or variable frequency. There are several known devices which utilize transistors to produce a variable reactance. In general, these devices use the variation of some transistor parameter with a variation in emitter current. One method has been to vary the cutoff of the transistor with a variation of emitter current for frequencies above cutoff. Another method has been to utilize the change in emitter resistance with a change in emitter current.

Presently known transistor oscillators use two different principles of operation. The most commonly used is a circuit with positive feedback. This type of circuit is well known and can be used at any frequency at which the transistor is capable of providing amplification. The second type of oscillator is one in which a negative resistance is inserted in a tuned circuit by means of a transistor. A negative resistance can be obtained by operating the transistor at frequencies greater than cutoff. Also, several circuits are known that obtain a negative resistance by using a transistor with a gain greater than one. Both principles obtain a negative resistance by using point contact transistors.

The disadvantage of the prior art devices is that a considerable change in emitter current is required for a corresponding change in the inductive reactance thereof. Accordingly, in order to vary the reactance of a variable reactance device or the frequency of oscillation of a variable frequency oscillator a considerable change is required in the emitter current of the transistor. The present invention is capable of providing either a variable reactance device in which the inductive reactance can be varied over a wide range or a variable frequency oscillator in which the frequency can be controlled over a wide range by making minute changes in the emitter current of the transistor. This is accomplished by circuit means which will operate the transistor with its collector current in a saturated state.

An object of the present invention is to provide a device in which a small change of resistance thereof will result in a correspondingly large change in inductive reactance thereof.

Another object is to provide a circuit employing a transistor in which a small change in the emitter current of a transistor will result in a correspondingly large change in the inductive reactance of the circuit and a small change in resistance thereof.

A further object is to provide a variable reactance circuit employing a transistor in which a small change in the emitter current of a transistor will result in a correspondingly large change in the inductive reactance of the circuit.

Still another object is to provide an oscillator employing an inductor connected to a base electrode of a transistor in which maximum utilization of the inductor is effected.

Yet another object of the present invention is to provide a variable frequency oscillator employing a transistor in which the frequency of the oscillator can be varied over a wide range by a slight change in the emitter current of the transistor.

Other objects and many of the attendant advantages of this invention will be readily appreciated as the same becomes better understood by reference to the following detailed description when considered in connection with the accompanying drawing in which like reference numerals designate like parts throughout the figures thereof and wherein.

Figure 1:
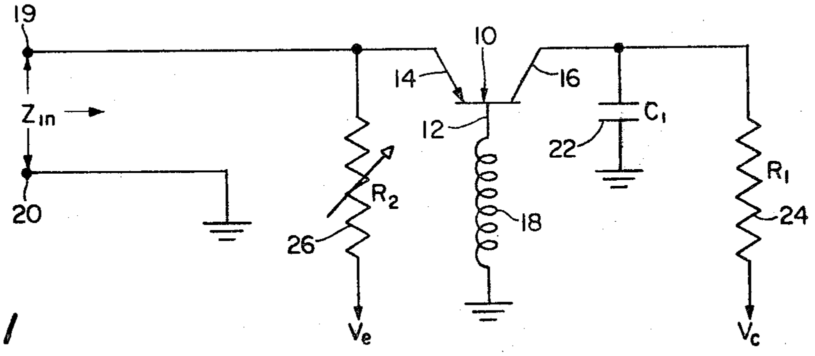
FIG. 1 is a schematic view of one embodiment of the invention.

Referring now to the drawing, wherein like reference numerals designate like or corresponding parts throughout the several views, there is shown in FIG. 1 a variable reactance device which includes a transistor 10 having a base electrode 12, an emitter electrode 14, and a collector electrode 16. An inductor 18 is connected between the base electrode 12 and ground, the ground providing a point of reference potential for the transistor 10.

A pair of input terminals 19 and 20 are provided with one terminal 19 connected to the emitter electrode 14 and the other terminal 20 connected to the ground. A capacitor 22 is connected between the collector electrode 16 and ground. The capacitance of the capacitor 22 is to be sufficiently large so that the collector of the transistor 10 is shorted to ground for the frequencies to be handled by the reactance device. A resistor 24 is connected between the collector electrode 16 and a supply voltage $V_c$. A variable resistor 26 is connected between the emitter electrode 14 and a source of supply voltage $V_e$.

Figure 2:
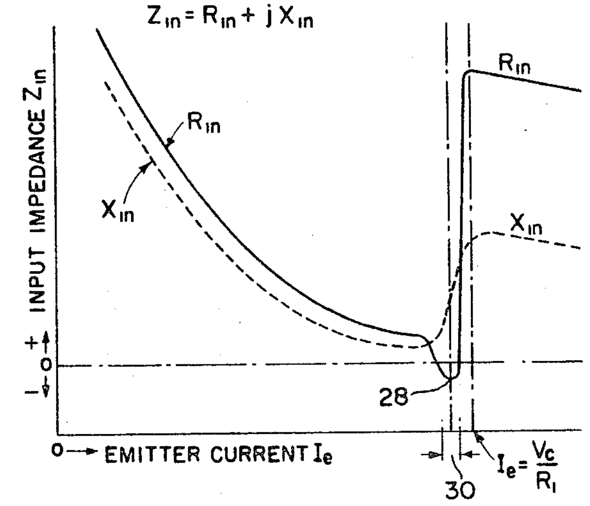
FIG. 2 is a graph for illustrating the point or range of operation of the present invention.

The theory of operation of the inductive reactance device and the various values to be chosen for the elements thereof can best be described by reference to FIG. 2 which is a graphic representation of the variation of the resistive and reactive components of the input impedance $Z_{in}$ across the terminals 19 and 20 of the variable reactance device with a change in emitter current $I_e$. As shown in FIG. 2 at low values of the emitter current $I_e$, the resistance and the inductive reactant $X_{in}$ will decrease with an increased emitter current $I_e$. This is due to the normal decrease of emitter impedance with an increase of emitter current. As the emitter current $I_e$ approaches the collector current limit $I_{c(limit)}$ which is equal to $V_c \div R_1$, the input resistance $R_{in}$ drops rapidly and depending upon the value of the components may go to a negative value as shown in FIG. 2. Thereafter, the input resistance $R_{in}$ increases extremely rapidly to a high value where it will remain with a further increase in emitter current. The area in which the input resistance $R_{in}$ is at or near a minimum point of operation 28 is the condition with which the present invention is concerned. In this region a change in $I_e$ slightly on either side of the point 28, such as in the area 30, will result in a small change in the input resistance $R_{in}$ as compared to the input inductive reactance $X_{in}$ of the circuit. Accordingly, the present invention contemplates variation of the emitter current $I_e$ in the range 30, this range being where the rate of change of the input resistance $R_{in}$ is less than the rate of change of the input inductive reactance $X_{in}$. In order to effect this operation the resistor 26 should be capable of variation for changing the emitter current $I_e$ within the range 30.

In order for the device shown in FIG. 1 to operate according to the graphic representation shown in FIG. 2 it is necessary that the collector current limit $I_{c(limit)}$ be relatively high and saturated. The collector current limit $I_{c(limit)}$ will be equal to $V_c \div R_1$ and the emitter current $I_e$ will operate in the range 30 which is slightly less than the collector current limit $I_{c(limit)}$. If the collector current limit $I_{c(limit)}$ is not high enough, the input resistance $R_{in}$ will not become negative, as shown in FIG. 2, but will go through a minimum positive value at an emitter current slightly less than the collector current limit. If the collector current limit is too high, the change of input reactance $X_{in}$ with emitter current is reduced. Therefore, there is an optimum value for the collector current limit depending upon the value of the components selected. In order to insure that the emitter current is slightly less than the collector current limit it is necessary that proper resistance values be chosen for the resistors 24 and 26.

The capacitance of the capacitor 22 is to be sufficiently large so as to short the collector electrode 16 to ground and provide a negligible reactance at the frequencies involved in the device. The transistor 10 is to be of the junction type. The following transistors were found to be adequate for operation within the circuit: Silicon, NPN, grown junction transistors, types 904 and 905 manufactured by Texas Instrument Company, and fused junction germanium transistors, type 2M54 manufactured by Westinghouse.

Figure 3:
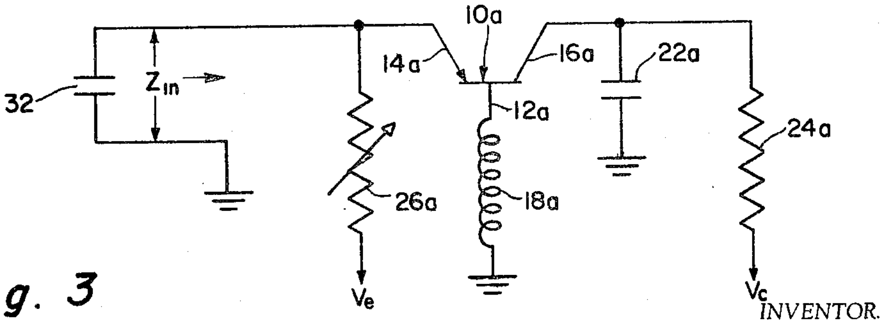
FIG. 3 is a schematic view of another embodiment of the invention.

FIG. 3 shows the present invention embodied in the form of a variable frequency oscillator. The components of the variable frequency oscillator are essentially the same as that for the inductive reactance device with the exception of a capacitor 32 which is connected between the emitter electrode **14*a* and ground, this capacitor 32 in conjunction with the inductor 18*a* setting the foundation for oscillation within the circuit. The input impedance $Z_{in}$ of the oscillator is measured across the capacitor 32 and when plotted versus the emitter current $I_e$ the input resistance $R_{in}$ and the input inductive reactance $X_{in}$ will take the same form as shown in FIG. 2. Accordingly, the variable resistor 26*a* is to be designed so that the emitter current $I_e$ can be varied within the range 30**, thereby allowing a wide range of frequencies to be effected within the circuit with a corresponding slight change in emitter current $I_e$.

The present invention contemplates a further embodiment with circuitry identical to that as shown in FIG. 3 with the exception that a fixed resistance would be substituted for variable resistor **26*a*. This will form a fixed frequency oscillator. The resistor 24*a* and a substituted fixed resistor for resistor 26*a* are to be designed so that the emitter current will fix the operation of the circuit at point 28** as shown in FIG. 2. Accordingly, the design will be such that the rate of change of the input resistance $R_{in}$ will be at a minimum.

It is now readily apparent that the present invention provides a simple transistor circuit in which a small change in emitter current will effect a large change in inductive reactance with a correspondingly small change in resistance within the circuit. The invention can be embodied in either a variable reactance device or a variable or fixed frequency oscillator.

Obviously, many modifications and variations of the present invention are possible in the light of the above teachings. It is therefore to be understood that within the scope of the appended claims the invention may be practiced otherwise than as specifically described.

I claim:

1. A variable reactance device comprising:

(a) a transistor having a base electrode, an emitter electrode and a collector electrode;
(b) a pair of input leads with one lead connected to said emitter electrode and the other lead connected to a point of reference potential;
(c) an inductive circuit connected between the base electrode and said point of reference potential;
(d) circuit means connected between the collector electrode and a point of supply voltage for providing a maximum collector current so that the transistor is capable of operating in a saturated condition;
(e) circuit means connected between the emitter electrode and another point of supply voltage for varying the emitter current in a range where the resistance of said device as seen across said leads is negative and has a rate of change which is less than the rate of change of an inductive reactance as seen across said leads, whereby the circuit means connected to the emitter electrode can be used to effect a large change in inductive reactance as seen across said input leads as compared to the change of resistance as seen across said leads.

2. A variable reactance device comprising:

(a) a junction type transistor having a base electrode, an emitter electrode and a collector electrode and a gain less than one;
(b) a pair of input leads with one lead connected to said emitter electrode and the other lead connected to a point of reference potential;
(c) an inductor connected between said base electrode and said point of reference potential;
(d) a capacitor connected between said collector electrode and said point of reference potential having a capacitance such that it has negligible reactance and shorts the collector to ground at signal frequencies to be received by said pair of input leads;
(e) a resistor connected between said collector electrode and a point of supply voltage so as to provide a collector current;
(f) a variable resistor connected between said emitter electrode and another point of supply voltage so as to provide a variable emitter current;
(g) the resistance values of said resistor and said variable resistor being such that the emitter current is slightly less than the collector current limit with the resistance of the device as seen across said input leads being negative;
(h) said variable resistor being capable of operating in a range of resistance values where the rate of change of the resistance as seen across said input leads is less than the rate of change of an inductive reactance as seen across said leads, whereby a change in resistance of the variable resistor will result in a large change in inductive reactance of the device as seen across said input leads as compared to the change of the resistance as seen across said leads.

References Cited by the Examiner

UNITED STATES PATENTS

| | | | |
|---|---|---|---|
| 2,704,792 | 3/1955 | Eberhard et al. | 333—80 |
| 2,750,508 | 6/1956 | Waldhauer | 331—117 |
| 2,769,908 | 11/1956 | Stansel | 331—115 |
| 2,820,145 | 1/1958 | Wolfendale | 331—115 |

ROY LAKE, *Primary Examiner.*

S. H. GRIMM, *Assistant Examiner.*